United States Patent
Lung et al.

(10) Patent No.: US 9,970,988 B2
(45) Date of Patent: May 15, 2018

(54) RELAY ABNORMALITY DETECTION DEVICE AND POWER CONDITIONER

(71) Applicant: TABUCHI ELECTRIC CO., LTD., Osaka-shi, Osaka (JP)

(72) Inventors: Chienru Lung, Osaka (JP); Hideki Hidaka, Amagasaki (JP)

(73) Assignee: TABUCHI ELECTRIC CO., LTD., Osaka-shi (JP)

( * ) Notice: Subject to any disclaimer, the term of this patent is extended or adjusted under 35 U.S.C. 154(b) by 0 days. days.

(21) Appl. No.: 15/386,397

(22) PCT Filed: Nov. 20, 2015

(86) PCT No.: PCT/JP2015/082782
§ 371 (c)(1),
(2) Date: Dec. 21, 2016

(87) PCT Pub. No.: WO2017/085883
PCT Pub. Date: May 26, 2017

(65) Prior Publication Data
US 2017/0168115 A1  Jun. 15, 2017

(51) Int. Cl.
*G01R 31/327* (2006.01)
*H02H 7/26* (2006.01)
(Continued)

(52) U.S. Cl.
CPC ..... *G01R 31/3278* (2013.01); *G01R 31/3277* (2013.01); *H02H 7/26* (2013.01);
(Continued)

(58) Field of Classification Search
CPC .... G01R 31/00; G01R 31/013; G01R 31/327; G01R 31/3277; G01R 31/3278;
(Continued)

(56) References Cited

U.S. PATENT DOCUMENTS 6,320,769 B2 * 11/2001 Kurokami ......... H02M 7/53873
                                                             323/906
9,608,442 B2 *  3/2017 Mumtaz ..................... H02J 3/00
(Continued)

FOREIGN PATENT DOCUMENTS

JP        2007-174792 A       7/2007
JP        2008-035655 A       2/2008
(Continued)

*Primary Examiner* — Hoai-An D Nguyen
(74) *Attorney, Agent, or Firm* — Oliff PLC

(57) ABSTRACT

A relay abnormality detection device to detect an abnormality of a grid interconnection relay upon switching to grid independent operation and includes an abnormality detector to execute commercial power system voltage for determining whether or not there is a commercial power system voltage, if there is commercial power system voltage through the commercial power system voltage determination, first current determination of abnormality determination as to the specific relay according to whether or not there is an input current to the power conditioner in a state where a contact of the specific relay is controlled to open, and if there is no commercial power system voltage through commercial power system voltage determination, second current determination of abnormality determination as to the specific relay according to whether or not there is an output current from the power conditioner in the state where the contact of the specific relay is controlled to open.

10 Claims, 12 Drawing Sheets

(51) Int. Cl.
*H02M 7/44* (2006.01)
*H03H 7/01* (2006.01)
*H02J 3/38* (2006.01)
*H02J 7/35* (2006.01)

(52) U.S. Cl.
CPC ............... *H02J 3/383* (2013.01); *H02J 7/35* (2013.01); *H02M 7/44* (2013.01); *H03H 7/0115* (2013.01); *G01R 31/327* (2013.01); *Y02E 10/563* (2013.01); *Y02E 10/566* (2013.01)

(58) Field of Classification Search
CPC ...... G01R 31/333; H02H 7/26; H03H 7/0115; H02J 3/383; H02J 7/35; H02M 7/44; Y02E 10/563; Y02E 10/566
USPC ....... 324/415, 418, 422, 424, 500, 509, 512, 324/522, 537, 555, 600, 629, 76.11, 107, 324/120
See application file for complete search history.

(56) References Cited

U.S. PATENT DOCUMENTS

| | | | |
|---|---|---|---|
| 2002/0149950 A1* | 10/2002 | Takebayashi | H02M 5/45 363/16 |
| 2007/0235440 A1* | 10/2007 | Gu | H05B 1/0244 219/482 |
| 2007/0236187 A1* | 10/2007 | Wai | H02J 3/383 323/222 |
| 2009/0086520 A1* | 4/2009 | Nishimura | H02M 3/33576 363/133 |
| 2009/0213627 A1* | 8/2009 | Chen | H02M 7/219 363/74 |
| 2017/0288403 A1* | 10/2017 | Lung | H02J 3/381 |

FOREIGN PATENT DOCUMENTS

| | | |
|---|---|---|
| JP | 2011-135767 A | 7/2011 |
| JP | 2014-064415 A | 4/2014 |

* cited by examiner

RELAY ABNORMALITY DETECTION DEVICE AND POWER CONDITIONER

TECHNICAL FIELD

The present invention relates to an abnormality detection device for a relay for grid interconnection or the like, and a power conditioner.

BACKGROUND ART

A distributed DC power supply including a solar cell, a fuel cell, or the like includes a power conditioner configured to convert a frequency and a voltage to AC power adapted to a commercial power system in order for use in interconnection with the commercial power system.

The power conditioner includes a DC/DC converter configured to adjust DC power generated by the solar cell, the fuel cell, or the like to DC power having a predetermined voltage value, a DC/AC inverter configured to convert the DC power outputted from the DC/DC converter to AC power, an LC filter configured to remove a high frequency component from an output waveform of the DC/AC inverter, and the like.

In a case where a shunt fault occurs on a distribution line used by the power conditioner in grid connected operation, connected to the solar cell, the fuel cell, or the like, or power transmission from a substation to the distribution line stops due to planned power outage or the like and islanding operation is established, in order to prevent influence on operation of a sectionalizing switch and secure safety during maintenance of the distribution line and the like, the power conditioner includes a control unit configured to open a grid interconnection relay to separate the distributed power supply from the distribution line.

When the control unit of the power conditioner subsequently closes a stand-alone power system relay, the distributed power supply supplies AC power to a stand-alone power system separated from the commercial power system or to an independent stand-alone power system not interconnected with the commercial power system.

The control unit of the power conditioner includes a current control block configured to control the DC/AC inverter so as to output an AC current in synchronization with a phase of the commercial power system upon grid interconnection, and a voltage control block configured to control the DC/AC inverter so as to output an AC voltage at a predetermined level to the stand-alone power system upon power system separation.

The voltage at the predetermined level corresponds to a voltage for low-voltage customers prescribed in Electricity Business Act, Article 26 and the Ordinance for Enforcement of the Act, Article 44, and falls within 101±6 V with respect to a standard voltage 100 V and within 202±20 V with respect to a standard voltage 200 V.

Upon grid independent operation of supplying power to a stand-alone power system while separated from a commercial power system, it is necessary to detect beforehand whether or not a contact of a grid interconnection relay is normal in order to prevent reverse charge to the commercial power system and asynchronous input. If the contact of the grid interconnection relay is abnormal due to welding or the like, it is necessary to inhibit transition from grid connected operation to grid independent operation.

Patent Literature 1 discloses a grid interconnection device including a filter circuit configured to smooth AC power from an inverter circuit, an inverter circuit controller configured to control an operation state of the inverter circuit, a controller configured to control an interconnected state or a separated state of a grid interconnection relay, a current detector connected between the filter circuit and the grid interconnection relay and configured to detect a current flowing to the filter circuit, and an abnormality detector configured to detect an abnormality of the grid interconnection device in accordance with a control state of the grid interconnection relay and a detection result by the current detector while the inverter circuit controller controls to stop the inverter circuit.

The abnormality detector is configured to determine whether or not the contact of the grid interconnection relay is welded in accordance with whether or not a reactive current flows from the commercial power system to a capacitor of the filter circuit while the inverter circuit is stopped.

Patent Literature 2 proposes a grid interconnection device configured to detect whether or not a first grid interconnection relay or a second grid interconnection relay each included in a grid interconnection relay has welding before a DC/AC inverter circuit is interconnected with a commercial power system by detecting, by means of a photocoupler or the like, a potential difference between an input end of the first grid interconnection relay and an output end of the second grid interconnection relay, and a potential difference between an output end of the first grid interconnection relay and an input end of the second grid interconnection relay while the commercial power system normally operates, the inverter circuit is controlled to stop, and the grid interconnection relay is controlled to open.

The grid interconnection device is configured to execute detection in a similar manner by operating the inverter circuit upon power cut of the commercial power system.

Patent Literature 3 discloses a grid interconnection inverter device configured to check that both an interconnection switch and an inverter circuit are normal and then safely start operation interconnected with a commercial power system.

The grid interconnection inverter device includes the inverter circuit configured to convert DC power supplied from a DC power supply to AC power, an output voltage detector configured to detect an output voltage of the inverter circuit, the interconnection switch configured to establish interconnection between the inverter circuit and the commercial power system, a grid voltage detector configured to detect a voltage of the commercial power system, and a control circuit configured to control the inverter circuit and the interconnection switch.

The control circuit is configured to check that the interconnection switch is opened in accordance with a detection value of the output voltage detector and then start the inverter circuit, and control to close the interconnection switch if the detection value of the output voltage detector is substantially equal to a detection value of the grid voltage detector.

The grid interconnection inverter device is provided, between the inverter circuit and the interconnection switch, with a current limiting resistor configured to consume a current generated by a voltage difference between the inverter circuit and the commercial power system, and a resistor short-circuit switch configured to short-circuit the current limiting resistor. The grid interconnection inverter device is configured to control to close the resistor short-circuit switch at predetermined timing after the control circuit closes the interconnection switch.

Patent Literature 4 discloses a power conversion device configured to detect an abnormality of a switch disposed between a power converter and a grid independent operation terminal.

The power conversion device includes the power converter configured to convert power supplied from an external device to predetermined power, a first switch connected between a grid connected operation terminal connected to a power system and the power converter, a second switch connected between the grid independent operation terminal connected to a load and the power converter, a voltage detector configured to detect a voltage of the grid independent operation terminal, and a controller configured to control the power converter, the first switch, and the second switch.

The controller is configured to output a control signal to each of the first switch and the second switch to open the switches, and execute abnormality determination of determining whether or not the second switch has an abnormality in accordance with a voltage of the grid independent operation terminal detected by the voltage detector in a control state of causing the power converter to output a predetermined voltage.

CITATION LIST

Patent Literatures

Patent Literature 1: JP 2008-35655 A
Patent Literature 2: JP 2011-135767 A
Patent Literature 3: JP 2007-174792
Patent Literature 4: JP 2014-64415 A

SUMMARY OF INVENTION

Technical Problems

The abnormality detector in the grid interconnection device disclosed in Patent Literature 1 is configured to stop the inverter circuit upon grid interconnection or power system separation and detect whether or not a reactive current flows from the commercial power system to the filter circuit. The abnormality detector thus fails to detect an abnormality of the grid interconnection relay in a case where grid independent operation starts due to power cut of the commercial power system.

The grid interconnection device disclosed in Patent Literature 2 needs to include additional circuit elements configured to detect the potential difference between the input end of the first grid interconnection relay and the output end of the second grid interconnection relay and the potential difference between the output end of the first grid interconnection relay and the input end of the second grid interconnection relay. The grid interconnection device thus configured problematically leads to a high cost for these components.

Furthermore, power cut is detected only in accordance with whether or not the commercial power system voltage is within an appropriate range under operation rules, and is thus possibly detected erroneously due to noise. In a case where an abnormality of the grid interconnection relay is detected by operating the DC/AC inverter circuit upon power cut of the commercial power system, abnormality detection is possibly executed erroneously only in accordance with voltage variation depending on a connection state of a load to the commercial power system.

The grid interconnection inverter device disclosed in Patent Literature 3 leads to a high cost for components and fails to achieve interconnection with the commercial power system if the resistor short-circuit switch is out of order.

The power conversion device disclosed in Patent Literature 4 highly possibly causes erroneous determination if the second switch is connected with a load connected to the stand-alone power system when the power converter outputs a predetermined voltage.

Similarly, as to a stand-alone solar power generator system in which a power generator system including a single-phase AC dynamo is provided with a distributed power supply including a solar panel and a power supply switching relay including a normally opened contact A and a normally closed contact B achieves complementary power supply to a load of a stand-alone power system, the stand-alone solar power generator system is required to avoid switching power supply if the power supply switching relay has an abnormality with a welded contact or the like.

In view of the problems mentioned above, an object of the present invention is to provide a relay abnormality detection device configured to accurately detect an abnormality of a specific relay such as a grid interconnection relay or a power supply switching relay in a case where grid independent operation starts due to power cut or the like of a commercial power system with no need for a high cost for components, and also provide a power conditioner.

Solution to Problems

In order to achieve the object mentioned above, as recited in claim 1 of the patent claims, according to a first feature of a relay abnormality detection device of the present invention, the relay abnormality detection device is configured to detect an abnormality of a specific relay upon switching to grid independent operation and is incorporated in a power conditioner including an inverter configured to convert DC power to AC power, and an LC filter configured to remove a high frequency component from an output voltage of the inverter, the power conditioner configured to switch between grid connected operation by interconnection with a commercial power system via a specific relay for grid interconnection and grid independent operation by power supply to a stand-alone power system via a stand-alone power system relay or configured to switch between power supply from the commercial power system via a specific relay for power supply switching and power supply by grid independent operation, and the relay abnormality detection device includes an abnormality detector configured to execute: commercial power system voltage determination of determining whether or not there is a commercial power system voltage; if it is determined that there is a commercial power system voltage through the commercial power system voltage determination, first current determination of abnormality determination as to the specific relay according to whether or not there is an input current to the power conditioner in a state where a contact of the specific relay is controlled to open; and if it is determined that there is no commercial power system voltage through the commercial power system voltage determination, second current determination of abnormality determination as to the specific relay according to whether or not there is an output current from the power conditioner in the state where the contact of the specific relay is controlled to open.

The commercial power system voltage determination is initially executed upon switching to grid independent operation to determine whether or not there is a commercial power system voltage. If it is determined that there is commercial power system voltage, the first voltage determination is executed. If it is determined that there is no commercial power system voltage, the second voltage determination is executed.

The first current determination includes determining whether or not the specific relay such as a grid interconnection relay has an abnormality in accordance with whether or not a current flows from the commercial power system into the power conditioner in the state where the contact of the grid interconnection relay is controlled to open.

The second current determination includes determining whether or not the specific relay has an abnormality in accordance with whether or not a current flows out of the power conditioner to a load connected with the commercial power system in the state where the contact of the specific relay is controlled to open. Abnormality determination as to the specific relay is thus appropriately executed while avoiding reverse charge to the commercial power system and asynchronous input.

As recited in claim 2, according to a second feature of the relay abnormality detection device in addition to the first feature, assuming that the LC filter has capacitor capacity $C_{inv}$, internal resistance $R_c$, and a capacitor current $i_c$, and a stand-alone power system voltage $e_{sd}$ is a measurement value, the first current determination includes calculation, as the input current, of the capacitor current $i_c$ in accordance with a mathematical expression [Expression 1].

$$i_c = \frac{sC_{inv}}{sR_cC_{inv} + 1} \cdot e_{sd} \qquad \text{[Expression 1]}$$

Measured with use of a known voltage detection circuit configured to detect an output voltage of a stand-alone power system is the stand-alone power system voltage $e_{sd}$, which is substituted into the mathematical expression [Expression 1] to calculate the value of the current flowing into the capacitor of the LC filter. Whether or not a current flows from the commercial power system via the specific relay is thus determined with no additional current detection circuit.

If the contact of the specific relay is welded, the commercial power system voltage and the stand-alone power system voltage have equal instantaneous values and variation in current flowing into the capacitor is captured. Whether or not the specific relay has welding is determined in accordance with a variation state of the current flowing into the capacitor. If the specific relay does not short-circuit, the current flowing into the capacitor is substantially zero. In the mathematical expression, s is a Laplacian operator (Laplace transform).

As recited in claim 3, according to a third feature of the relay abnormality detection device in addition to the second feature, the first current determination includes determining that the specific relay has an abnormality if the input current measured in a predetermined sampling cycle has an absolute value not less than a predetermined threshold a plurality of consecutive times and the absolute value of the input current increases every time the input current is measured.

It is determined that current flows into the capacitor configuring the LC filter from the commercial power system if the current value based on the value measured in a predetermined sampling cycle has an absolute value not less than a predetermined threshold a plurality of consecutive times and the absolute value increases.

As recited in claim 4, according to a fourth feature of the relay abnormality detection device in addition to any one of the first to third features, assuming that the LC filter has capacitor capacity $C_{inv}$, internal resistance $R_c$, and a capacitor current $i_c$, the stand-alone power system has a voltage $e_{sd}$, and an inverter current $i_{inv}$ is a measurement value, the second current determination includes calculating, as the output current, an output current $i_{sp}$ of the power conditioner in accordance with a mathematical expression [Expression 2].

$$i_{sp} = i_{inv} - i_c \qquad \text{[Expression 2]}$$

If there is no commercial power system voltage, the inverter is driven and the power conditioner outputs the predetermined stand-alone power system voltage $e_{sd}$, the inverter output current $i_{inv}$ thus measured and the stand-alone power system voltage $e_{sd}$ are substituted into the mathematical expression [Expression 1], and the output current $i_{sp}$ of the power conditioner is calculated in accordance with the mathematical expression [Expression 2]. If the contact of the specific relay is welded, there is detected a current flowing out of the power conditioner to the load connected with the commercial power system.

As recited in claim 5, according to a fifth feature of the relay abnormality detection device in addition to the fourth feature, the second current determination includes obtaining a difference between values prior to and subsequent to a maximum value of the output current of the power conditioner, and determining that the specific relay has an abnormality if the difference is not less than a predetermined threshold a plurality of consecutive times and an absolute value of the output current of the power conditioner decreases every time the output current is measured.

If a current flows out of the power conditioner to the load connected with the commercial power system, the voltage decreases and the current value gradually decreases. The second current determination includes, if the calculated difference between the maximum values of the output current of the power conditioner is not less than the predetermined threshold a plurality of consecutive times and the absolute value of the output current of the power conditioner decreases every time the output current is measured, determining that a current flows out of the power conditioner to the load connected with the commercial power system. If the commercial power system is connected with no load, the output current of the power conditioner has a constant peak value.

As recited in claim 6, according to a sixth feature of the relay abnormality detection device in addition to any one of the first to fifth features, the abnormality detector is configured to execute the first current determination or the second current determination after each contact of the specific relay is controlled to open, and execute the first current determination or the second current determination every time one of the contacts is controlled to close independently.

The number of contacts of the specific relay varies depending on whether the power conditioner has single-phase output or three-phase output. Furthermore, the results of the determination processes differ depending on which one of the contacts is welded. If the first current determination and the second current determination are executed after each contact of the specific relay is controlled to open and it is determined that there is welding, it is clarified that all the contacts are welded. If the first current determination and the second current determination are executed every time one of the contacts is controlled to close independently and it is determined that there is welding, it is clarified that the contact controlled to open is welded.

As recited in claim 7, according to a seventh feature of the relay abnormality detection device in addition to any one of the first to sixth features, the abnormality detector is configured to further execute, before or after the first current determination or the second current determination, voltage setting of setting an output voltage of the power conditioner at abnormality detection to a different value and setting a reference voltage for abnormality determination as to the specific relay to a different value in accordance with a result of the commercial power system voltage determination, and voltage determination of abnormality determination as to the specific relay according to a magnitude relation between a difference between a voltage of the power conditioner and a voltage of the commercial power system and a value obtained by multiplying the reference voltage by a predetermined confidence coefficient in the state where the contact of the specific relay is controlled to open.

If the contact of the specific relay is welded, the difference between the voltage of the power conditioner and the voltage of the commercial power system is substantially zero. Whether or not the grid interconnection relay has an abnormality is thus determined in accordance with the difference. The output voltage of the power conditioner is set to a different value upon abnormality detection in accordance with a result of the commercial power system voltage determination. It is thus possible to avoid beforehand defects such as reverse charge to the commercial power system and asynchronous input.

As recited in claim 8, according to an eighth feature of the relay abnormality detection device in addition to any one of the first to seventh features, the commercial power system voltage determination includes determining whether or not there is a commercial power system voltage in accordance with a magnitude relation between a value obtained by multiplying a preliminarily set value of the stand-alone power system voltage of the power conditioner by a predetermined confidence coefficient and the commercial power system voltage, and a magnitude relation between a value obtained by multiplying a stand-alone power system frequency by a predetermined confidence coefficient and a commercial power system frequency.

Checking the commercial power system voltage as well as the commercial power system frequency enables accurate determination as to whether or not there is a commercial power system voltage with no error due to noise or the like.

As recited in claim 9, according to a first feature of a power conditioner of the present invention, the power conditioner of a single-phase or three-phase type includes a control unit configured to switch between grid connected operation by interconnection with a commercial power system via a specific relay for grid interconnection and grid independent operation by power supply to a stand-alone power system via a stand-alone power system relay, or a control unit configured to switch between power supply from the commercial power system via a specific relay for power supply switching and power supply by grid independent operation, in which the control unit includes the relay abnormality detection device having any one of the first to eighth features.

In a case where the abnormality detector determines that the contact of the specific relay is welded, defects such as reverse charge to the commercial power system and asynchronous input are prevented beforehand by avoiding grid independent operation.

As recited in claim 10, according to a second feature of the power conditioner of the present invention, the power conditioner of a single-phase or three-phase type includes a control unit configured to switch between power supply from a commercial power system via a specific relay for power supply switching and power supply by grid independent operation, the specific relay for power supply switching including a contact A and a contact B, in which the control unit incorporates an abnormality detection device configured to execute the commercial power system voltage determination and the second current determination according to the first feature of the relay abnormality detection device, and the voltage setting and the voltage determination according to the seventh feature of the relay abnormality detection device.

Advantageous Effects of Invention

As described above, the present invention provides a relay abnormality detection device configured to accurately detect an abnormality of a specific relay such as a grid interconnection relay or a power supply switching relay in a case where grid independent operation starts due to power cut or the like of a commercial power system with no need for a high cost for components, and also provides a power conditioner.

DESCRIPTION OF EMBODIMENTS

A relay abnormality detection device and a power conditioner according to the present invention will now be exemplarily described below with reference to the drawings.

Figure 1:
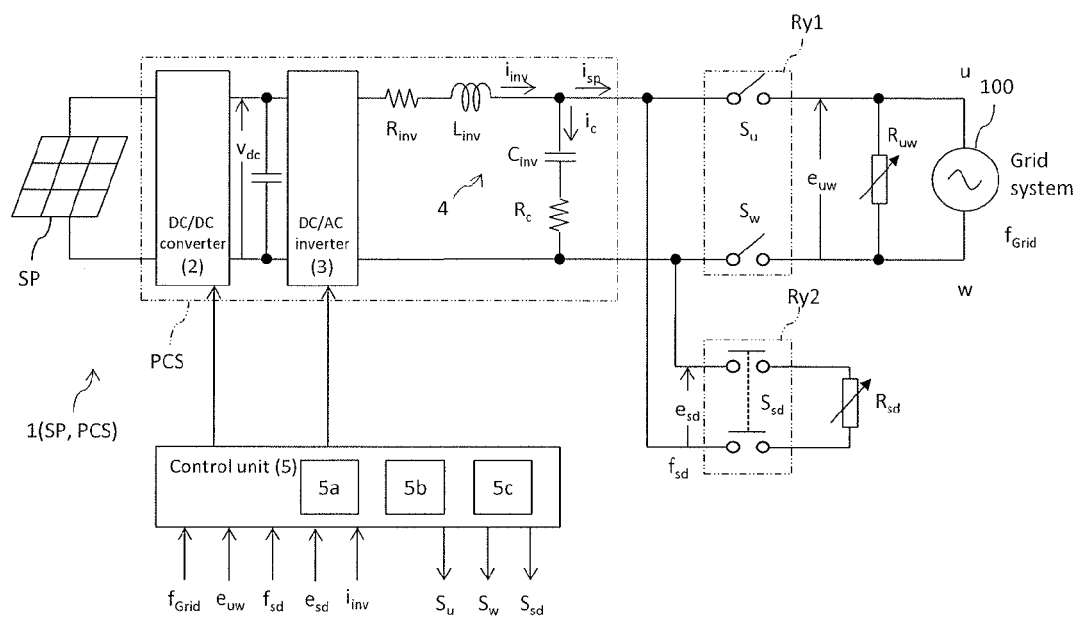
FIG. 1 is a circuit block configuration diagram of a distributed power supply including a power conditioner.

FIG. 1 depicts a solar power generator 1 exemplifying a distributed power supply. The solar power generator 1 includes a solar panel SP and a power conditioner PCS connected to the solar panel SP.

DC power generated by the solar panel SP is supplied to the power conditioner PCS via a DC circuit breaker and a surge suppressor (not depicted).

The power conditioner PCS includes a DC/DC converter 2 configured to raise a DC voltage generated by the solar panel SP to a predetermined DC link voltage $V_{dc}$, a DC/AC inverter 3 configured to convert the DC link voltage $V_{dc}$ raised by the DC/DC converter 2 to a predetermined AC voltage, an LC filter 4 configured to remove a higher harmonic wave from the AC voltage outputted from the DC/AC inverter 3, a control unit 5 configured to control the DC/DC converter 2 and the DC/AC inverter 3, and the like.

AC power converted by the power conditioner PCS is supplied to an AC load $R_{uw}$ via a grid interconnection relay Ry1 in interconnection with a commercial power system 100. When the commercial power system 100 is separated due to power cut or the like, AC power is supplied to a load $R_{sd}$ connected to a stand-alone power system via a stand-alone power system relay Ry2. The grid interconnection relay Ry1 according to the present embodiment corresponds to a specific relay according to the present invention.

FIG. 1 depicts the grid interconnection relay Ry1 having contacts $S_u$ and $S_w$ and the stand-alone power system relay Ry2 having two contacts $S_{sd}$.

The control unit 5 of the power conditioner PCS includes a microcomputer, a memory, a peripheral circuit having an input/output circuit provided with an AD conversion unit and the like. The microcomputer includes a CPU configured to achieve expected functions by causing control programs stored in the memory to be executed.

Specifically, embodied by the control unit 5 are functional blocks as a converter controller 5a configured to control a boosting switch of the DC/DC converter 2, an inverter controller 5b configured to control a switch included in a bridge of the DC/AC inverter 3, and an abnormality detector 5c configured to detect an abnormality of the grid interconnection relay Ry1.

The converter controller 5a is configured to monitor an input voltage, an input current, and an output voltage of the DC/DC converter 2 and control maximum power point tracking (MPPT) of operating the solar panel SP at a maximum power point, as well as control to boost the DC/DC converter 2 and output the predetermined DC link voltage $V_{dc}$ to the DC/AC inverter 3.

The inverter controller 5b is configured to control the inverter 3 so as to achieve grid connected operation via the grid interconnection relay Ry1, or to control the inverter 3 so as to achieve grid independent operation via the stand-alone power system relay Ry2.

The inverter controller 5b includes functional blocks such as a current control block configured to control an output current of the inverter 3 so as to synchronize with a phase of a commercial power system voltage upon grid connected operation, a voltage control block configured to supply the stand-alone power system with AC power having a predetermined voltage upon power system separation, and an islanding operation detection block configured to detect whether or not grid connected operation is in an islanding operation state.

The abnormality detector 5c is configured to detect whether or not the grid interconnection relay Ry1 has an abnormality upon transition from grid connected operation to grid independent operation. If detecting that the grid interconnection relay Ry1 has an abnormality of contact welding, the abnormality detector 5c is configured to turn ON an alarm indicative of trouble and stop grid independent operation control by the inverter controller 5b. In other words, the abnormality detector 5c functions as the abnormality detection device according to the present invention.

The AD conversion unit in the control unit 5 receives a monitor signal of an output current $i_{inv}$ detected by a current transformer provided downstream of an inductor L configuring the LC filter 4.

Furthermore, the AD conversion unit in the control unit 5 receives a monitor signal of a stand-alone power system voltage $e_{sd}$ of the power conditioner PCS detected by a resistance voltage divider circuit provided upstream of the stand-alone power system relay Ry2, as well as a monitor signal of a commercial power system voltage $e_{uw}$ detected by a resistance voltage divider circuit provided downstream of the grid interconnection relay Ry1.

The stand-alone power system voltage $e_{sd}$ and a stand-alone power system frequency $f_{sd}$ of the power conditioner PCS as well as the commercial power system voltage $e_{uw}$ and a commercial power system frequency $f_{Grid}$ are obtained in accordance with the monitor signals received by the AD conversion unit.

The inverter controller 5b closes the grid interconnection relay Ry1 to achieve grid connected operation if power generated by the solar panel SP has a value enabling interconnection with the commercial power system, and opens the grid interconnection relay Ry1 to achieve separation from the commercial power system if power generated by the solar panel SP decreases or the islanding operation detection block detects the islanding operation state.

If power generated by the solar panel SP has an adequate value for grid independent operation during separation from the commercial power system due to the islanding operation state, the inverter controller 5b starts the abnormality detector 5c for detection of an abnormality of the Grid interconnection relay Ry1.

If the abnormality detector 5c determines that the grid interconnection relay Ry1 is normal, the inverter controller 5b is configured to start the inverter 3 and open the stand-alone power system relay Ry2 to achieve grid independent operation. In contrast, if the abnormality detector 5c determines that the grid interconnection relay Ry1 is abnormal, the inverter controller 5b is configured to stop the DC/AC inverter 3 without closing the stand-alone power system relay Ry2.

Described below is a method of detecting an abnormality of the grid interconnection relay Ry1, which is executed by the abnormality detector 5c.

Abnormality detection executed by the abnormality detector 5c includes contact control of controlling to open or close the contacts of the grid interconnection relay Ry1, commercial power system voltage determination, setting an output voltage of the inverter 3, current determination, and voltage determination.

The abnormality detector 5c is configured to execute the current determination and the voltage determination to be described later, of determining whether or not the contacts are welded after all the contacts $S_u$ and $S_w$ of the grid interconnection relay Ry1 are controlled to open, and execute the current determination and the voltage determination every time the contact $S_u$ or $S_w$ is controlled to close.

If the abnormality detector 5c executes the current determination and the voltage determination after all the contacts $S_u$ and $S_w$ of the grid interconnection relay Ry1 are controlled to open and determines that the contacts are welded, it is clarified that all the contacts $S_u$ and $S_w$ are welded.

If the abnormality detector 5c determines that the grid interconnection relay Ry1 is normal, the abnormality detector 5c executes the current determination and the voltage determination every time the contact $S_u$ or $S_w$ is controlled to close independently. If the abnormality detector 5c determines that the contact is welded in either one of the cases, it is clarified that the contact being controlled to open upon the determination is welded.

Figure 2:
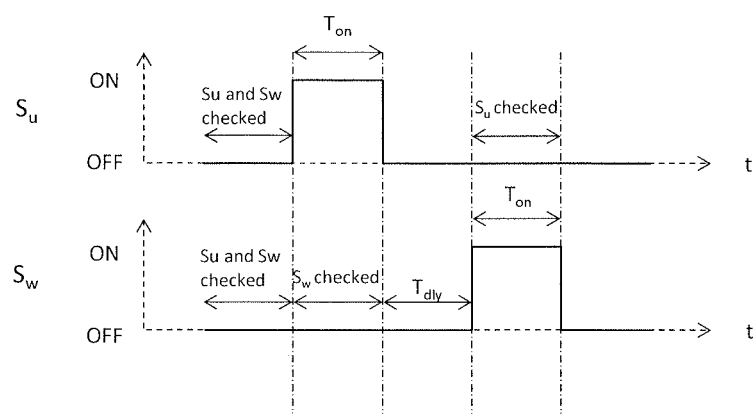
FIG. 2 is an explanatory chart of ON/OFF operation of a grid interconnection relay upon abnormality detection.

FIG. 2 indicates a control sequence for the grid interconnection relay Ry1, or timing of ON/OFF control of the contacts $S_u$ and $S_w$ of the grid interconnection relay Ry1. When the abnormality detector 5c starts, the abnormality detector 5c executes the current determination and the voltage determination to check the contacts $S_u$ and $S_w$ that are controlled to open, subsequently controls to close the contact $S_u$ and executes the current determination and the voltage determination to check the contact $S_w$, and controls to open the contact $S_u$ then controls to close the contact $S_w$ after a predetermined delay period $T_{dly}$ and executes the current determination and the voltage determination to check the contact $S_u$.

Each check period and the delay period $T_{dly}$ are set to 200 msec. in the present embodiment. Such an open/close control sequence for the grid interconnection relay Ry1 corresponds to the step of the contact control described above. The delay period $T_{dly}$ is variable appropriately in accordance with the type of the grid interconnection relay.

Figure 3:
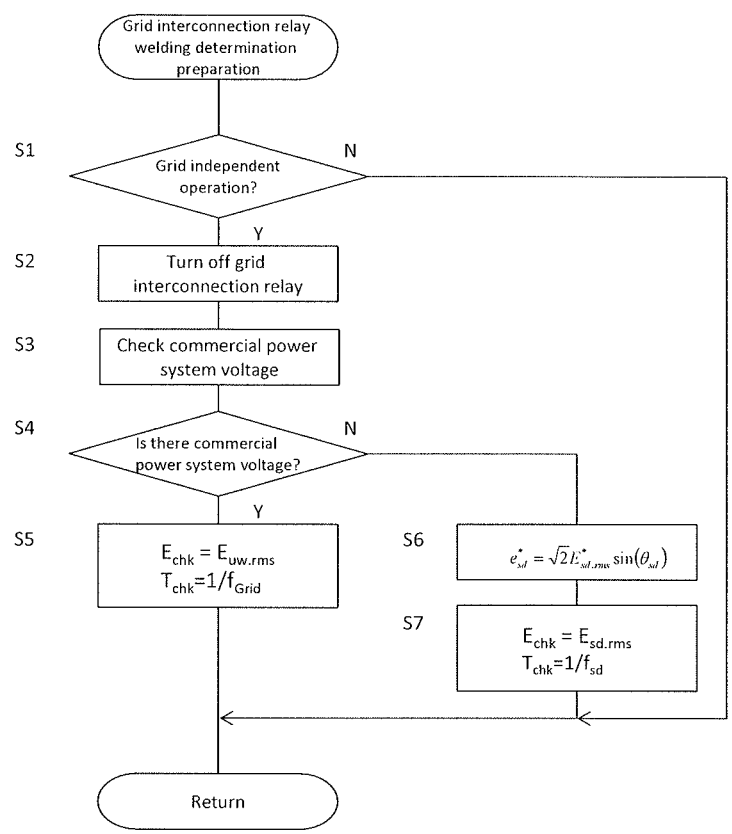
FIG. 3 is a flowchart of commercial power system voltage determination.

FIG. 3 depicts a welding determination preparation flow of the grid interconnection relay Ry1 executing the steps of the commercial power system voltage determination and the voltage setting.

In the commercial power system voltage determination step, in a case where grid independent operation is required (S1), all the contacts of the grid interconnection relay Ry1 are controlled to open (S2), the commercial power system voltage $e_{uw}$ is checked by the resistance voltage divider circuit provided downstream of the grid interconnection relay Ry1 (S3), and whether or not there is a commercial power system voltage is checked in accordance with the following mathematical expressions [Expression 3] (S4).

$$\begin{cases} |e_{uw}| \geq x \cdot E^*_{sd.rms} \\ f_{Grid} \geq x \cdot f_{sd} \end{cases} \quad \text{[Expression 3]}$$

In the mathematical expressions, $E^*_{sd.rms}$ is a command value of an output voltage effective value at grid independent operation, and x is a confidence coefficient set in the range 0<x<1 for securing determination accuracy and set to 0.5 in the present embodiment. The stand-alone power system frequency $f_{sd}$ is set to be equal to the commercial power system frequency $f_{Grid}$. The command value $E^*_{sd.rms}$ according to the present embodiment is set to 40 V that is lower than 100 V of a rated output voltage effective value at grid independent operation.

The commercial power system voltage is measured for at least one cycle (20 msec. in a case where the commercial power system frequency is 50 Hz) and an absolute value $|e_{uw}|$ of a maximum instantaneous value is obtained. The absolute value $|e_{uw}|$ is compared with a product of the command value $E^*_{sd.rms}$ of the output voltage effective value at grid independent operation and the confidence coefficient x. The commercial power system voltage is alternatively measured for a plurality of cycles to obtain an average of the absolute values $|e_{uw}|$ of the maximum instantaneous values of the respective cycles.

Furthermore, the commercial power system frequency $f_{Grid}$ is compared with a product of the stand-alone power system frequency $f_{sd}$ and the confidence coefficient x. The confidence coefficient x has a value for securement of determination reliability. As the value is more approximate to 1, determination is stricter with more influence of noise. In contrast, as the value is more approximate to 0, determination is less strict with less influence of noise. An intermediate value of 0.5 is preferred to be adopted typically.

In a case where the commercial power system voltage $|e_{uw}|$ is 0 V, the command value $E^*_{sd.rms}$ of the effective value of the stand-alone power system voltage is 40 V, and x is 0.5, the mathematical expressions [Expression 3] are as follows.

$$|e_{uw}|=0<0.5\times40=20$$

$$f_{Grid}=0<0.5\times50=25$$

In a case where the commercial power system voltage $|e_{uw}|$ is 141 V, the command value $E^*_{sd.rms}$ of the effective value of the stand-alone power system voltage is 40 V, and x is 0.5, the mathematical expressions [Expression 3] are as follows.

$$|e_{uw}|=141>0.5\times40=20$$

$$f_{Grid}=50>0.5\times50=25$$

Specifically, in step S4, it is determined that there is a commercial power system voltage if the two mathematical expressions [Expression 3] are both satisfied, and it is determined that there is no commercial power system voltage if none of the mathematical expressions is satisfied.

Steps S3 and S4 described above correspond to the commercial power system voltage determination step of determining whether or not there is a commercial power system voltage in accordance with a magnitude relation between a value obtained by multiplying a preliminarily set output voltage set value of the power conditioner PCS by a predetermined confidence coefficient and the commercial power system voltage, and a magnitude relation between a value obtained by multiplying a stand-alone power system frequency by a predetermined confidence coefficient and a commercial power system frequency.

The preliminarily set output voltage set value of the power conditioner PCS can have a rated voltage value necessary for grid independent operation, or can have an exclusive voltage value for abnormality detection, which is less than the rated voltage value. Even in a case where the commercial power system voltage is different from the grid independent operation rated voltage, whether or not there is a commercial power system voltage is determined accurately by appropriately setting the output voltage set value and the confidence coefficient.

As in the mathematical expressions [Expression 3], checking the commercial power system voltage as well as the commercial power system frequency enables accurate determination as to whether or not there is a commercial power system voltage with no error due to noise or the like.

If it is determined that there is a commercial power system voltage in the commercial power system voltage determination step, a reference value $E_{chk}$ for contact welding determination in the voltage determination is set to an effective value $E_{uw.rms}$ of the commercial power system voltage, and a delay period $T_{chk}$ for determination of a difference between the stand-alone power system voltage and the commercial power system voltage is set to a reciprocal of the commercial power system frequency (S5).

If it is determined that there is no commercial power system voltage, a command value of the output voltage of the power conditioner PCS at abnormality detection is set (S6), the reference value $E_{chk}$ for contact welding determination is set to an effective value $E_{sd.rms}$ of the stand-alone power system voltage, and the delay period $T_{chk}$ in this case is set to a reciprocal of the stand-alone power system frequency (S7).

In other words, if it is determined that there is a commercial power system voltage, the power conditioner PCS is stopped to have the output voltage of 0 V. Steps S5 to S7 described above correspond to the voltage setting step.

The output voltage mentioned above has a command value $e^*_{sd}$ satisfying the following mathematical expression [Expression 4].

$$e^*_{sd} = \sqrt{2} E^*_{sd.rms} \sin(\theta_{sd}) \qquad \text{[Expression 4]}$$

In the mathematical expression, $E^*_{sd.rms}$ is the command value of the effective value of the stand-alone power system voltage and $\theta_{sd}$ is a phase angle of the stand-alone power system voltage. In the present embodiment, $E^*_{sd.rms}=40$ V is the command value at detection of an abnormality of the grid interconnection relay Ry1, and the command value $E^*_{sd.rms}$ after normality determination is 100 V. The command value for the abnormality detection and the command value after normality determination are merely exemplary and can be set appropriately.

The commercial power system voltage determination step of determining whether or not there is a commercial power system voltage is executed before the voltage setting step, and the voltage setting step includes setting the stand-alone power system voltage of the power conditioner PCS and the reference voltage $E_{chk}$ for abnormality determination as to the grid interconnection relay Ry1 to different values in accordance with the result of the commercial power system voltage determination step.

The power conditioner PCS is controlled by the control unit 5 so as to transition to grid independent operation upon power cut of the commercial power system, but the commercial power system voltage temporarily decreases and recovers shortly in some cases. If the grid interconnection relay Ry1 has welding in such cases, an inconvenient situation with asynchronous input or the like may cause damage to the power conditioner PCS.

By executing the commercial power system voltage determination before the voltage setting so as to set the stand-alone power system voltage of the power conditioner PCS and the reference value for abnormality determination as to the grid interconnection relay Ry1 to different values in accordance with the result of the commercial power system voltage determination, abnormality determination as to the grid interconnection relay Ry1 is executed accurately with secured safety to avoid asynchronous input and reverse charge.

In a case where a commercial power system voltage is detected, contact welding determination is executed accurately with no damage to the power conditioner PCS by setting the stand-alone power system voltage of the power conditioner PCS to 0 V and the commercial power system voltage to the reference value.

Figure 4:
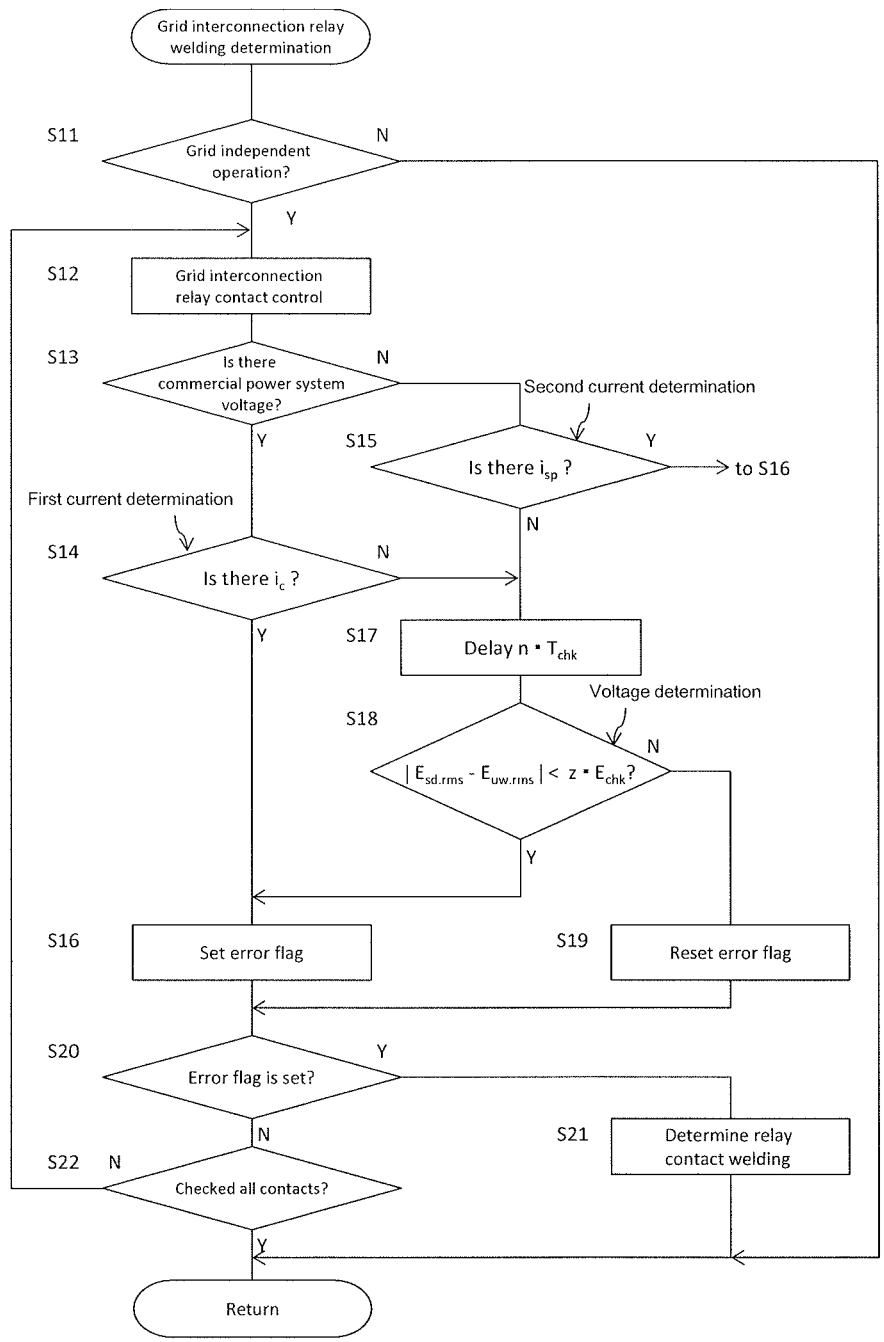
FIG. 4 is a flowchart of a method of detecting an abnormality of the grid interconnection relay.

FIG. 4 depicts a contact welding determination flow of the grid interconnection relay Ry1.

If grid independent operation starts (S11), the contact control step is executed (S12). If it is determined that there is a commercial power system voltage through the commercial power system voltage determination (S13, Y), first current determination (S14) of abnormality determination as to the grid interconnection relay Ry1 is executed in accordance with whether or not the power conditioner PCS has an input current in the state where the contacts of the grid interconnection relay Ry1 are controlled to open.

If it is determined that there is no commercial power system voltage through the commercial power system voltage determination (S13, N), second current determination (S15) of abnormality determination as to the grid interconnection relay Ry1 is executed in accordance with whether or not the power conditioner PCS has an output current in the state where the contacts of the grid interconnection relay Ry1 are controlled to open.

In the first current determination (S14), assuming that the LC filter 4 has capacitor capacity $C_{inv}$, internal resistance $R_c$, and a capacitor current $i_c$ and the stand-alone power system voltage $e_{sd}$ is a measurement value, calculated as an input current is the capacitor current $i_c$ in accordance with the following mathematical expression [Expression 5]. In the mathematical expression, s is a Laplacian operator (Laplace transform).

$$i_c = \frac{sC_{inv}}{sR_c C_{inv} + 1} \cdot e_{sd} \qquad \text{[Expression 5]}$$

The stand-alone power system voltage $e_{sd}$ is measured with use of the resistance voltage divider circuit configured to detect the output voltage $e_{sd}$ of the inverter, and the measurement value is substituted into the mathematical expression [Expression 5] to calculate a value of a current flowing into the capacitor of the LC filter 4.

If the grid interconnection relay Ry1 has a welded contact, the commercial power system voltage $e_{uv}$ and the stand-alone power system voltage $e_{sd}$ are regarded as having equal detection values.

Figure 5:
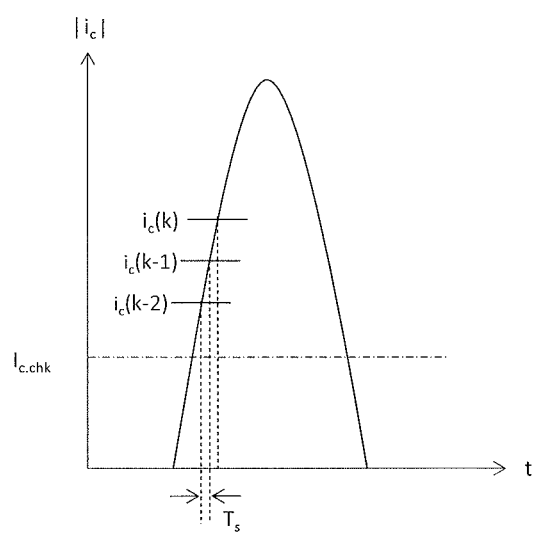
FIG. 5 is an explanatory graph of first current determination.

As indicated in FIG. 5, in the first current determination, in order to determine a variation state of an absolute value $|i_c|$ of the instantaneous capacitor current $i_c$ measured and calculated in a predetermined sampling cycle $T_s$, if satisfying conditions that the absolute value $|i_c|$ is not less than a threshold $I_{c.chk}$ at least three consecutive times and its value tends to increase (S14, Y), the grid interconnection relay Ry1 is determined to have a welded contact and a flag is set in an error flag memory area set in the memory (S16). Determination is optionally repeated a plurality of times in consideration of erroneous detection due to noise and in order for reliable detection of the variation state.

The threshold $I_{c.chk}$ can be obtained in accordance with the following mathematical expression [Expression 6]. In the mathematical expression, $P_{sd.rated}$ is rated output power at grid independent operation, $E^*_{sd.rms}$ is the command value of the effective value of the stand-alone power system voltage, and y is a confidence coefficient having a positive number satisfying y<1.

$$I_{c.chk} = y \cdot \frac{P_{sd.rated}}{\sqrt{2} \cdot E^*_{sd.rms}} \qquad \text{[Expression 6]}$$

The display panel of the power conditioner PCS is configured to turn ON abnormality indication when an error flag is set. The present embodiment is designed such that the command value $E^*_{sd.rms}$ of the effective value of the stand-alone power system voltage is 100 V and the confidence coefficient is 10% of a rated current (y=0.1) with the rated power $P_{sd.rated}$ of 1.5 kW at grid independent operation as a reference value, and the threshold $I_{c.chk}$ is set to 2 A and the sampling cycle $T_s$ is set to 50 psec. (corresponding to a switching cycle of the DC/AC inverter). The threshold is set to 10% of the rated current (1500/100×0.1×1.414=2). The predetermined sampling cycle $T_s$ has only to satisfy a condition of a reciprocal of a maximum switching frequency of a switching element configuring the inverter.

In order to determine the variation state of the absolute value $|i_c|$ of the instantaneous capacitor current $i_c$ in step S14, if a state not satisfying the conditions that the absolute value $|i_c|$ is not less than the threshold $I_{c.chk}$ at least three consecutive times and its value tends to increase lasts for a predetermined period (e.g. several cycles), it is determined that there is no current flowing from the commercial power system to the capacitor of the power conditioner PCS (S14, N) and the process flow proceeds to the voltage determination in step S18. Determination is optionally repeated a plurality of times in consideration of erroneous detection due to noise and in order for reliable detection of the variation state. If there is a commercial power system voltage and the contacts of the grid interconnection relay Ry1 are normal with no welding, the absolute value $|i_c|$ of the instantaneous capacitor current $i_c$ is constantly zero.

In the second current determination (S15), calculated from the capacitor capacity $C_{inv}$, the internal resistance $R_c$, the stand-alone power system voltage $e_{sd}$, and the capacitor current $i_c$ of the LC filter 4 and the inverter output current $i_{inv}$ as a measurement value in accordance with the following mathematical expression [Expression 7] is an output current $i_{sp}$ of the power conditioner PCS as an output current to the load connected with the commercial power system.

$$i_{sp} = i_{inv} - i_c \qquad \text{[Expression 7]}$$

If there is no commercial power system voltage, the inverter 3 is driven and the power conditioner PCS outputs the predetermined stand-alone power system voltage $e_{sd}$, the capacitor current $i_c$ obtained from the inverter current $i_{inv}$ thus measured and the stand-alone power system voltage $e_{sd}$ in accordance with the mathematical expression [Expression 5] is substituted into the mathematical expression [Expression 7] to calculate the output current $i_{sp}$ of the power conditioner PCS. The stand-alone power system voltage $e_{sd}$ is detected by the resistance voltage divider circuit configured to detect the output voltage $e_{sd}$ of the inverter.

If the grid interconnection relay Ry1 has a welded contact, there is detected a current flowing out of the power conditioner PCS to the load $R_{uw}$ connected to the commercial power system.

Figure 6:
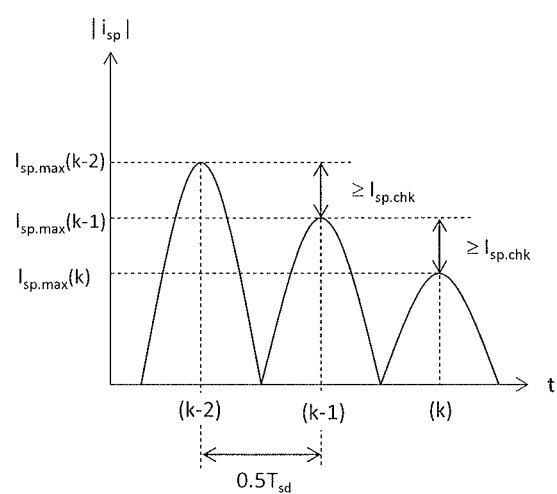
FIG. 6 is an explanatory graph of second current determination executed when a current is not less than a determination threshold.

As indicated in FIG. 6, in the second current determination, in order to determine a variation state of a difference in maximum value $I_{sp.max}$ of the output current $i_{sp}$ of the power conditioner PCS, if the difference is not less than a predetermined threshold $I_{sp.chk}$ three consecutive times and the instantaneous output current $i_{sp}$ has an absolute value $|i_{sp}|$ tending to decrease (S14, Y), the grid interconnection relay Ry1 is determined to have a welded contact and a flag is set in the error flag memory area set in the memory (S16). Determination is optionally repeated a plurality of times in consideration of erroneous detection due to noise and in order for reliable detection of the variation state.

The maximum value $I_{sp.max}$ of the output current $i_{sp}$ is obtained in accordance with a mathematical expression [Expression 8], and the threshold $I_{sp.chk}$ is obtained in accordance with a mathematical expression [Expression 9]. In the mathematical expression [Expression 9], $E^*_{sd.rms}$ is the effective value of the command value of the output voltage at grid independent operation.

$$I_{sp.max} = \sqrt{\frac{4}{T_{sd}} \int_0^{\frac{T_{sd}}{2}} i_{sp}^2(t) dt} \qquad \text{[Expression 8]}$$

$$I_{sp.chk} = y \cdot \frac{P_{sd.rated}}{\sqrt{2} \cdot E^*_{sd.rms}} \qquad \text{[Expression 9]}$$

If a current flows out of the power conditioner PCS to the load $R_{uw}$ connected with the commercial power system, the voltage decreases and the current value gradually decreases. In the second current determination, if the calculated difference in maximum value of the output current of the power conditioner PCS is not less than the predetermined threshold a plurality of consecutive times and the absolute value $|i_{sp}|$ of the instantaneous output current $i_{sp}$ tends to decrease, it is determined that a current flows out of the power conditioner PCS to the load $R_{uw}$ connected with the commercial power system.

Figure 7:
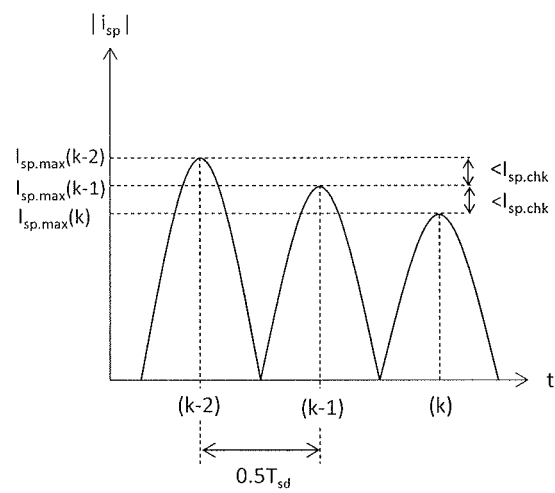
FIG. 7 is an explanatory graph of the second current determination executed when the current is not more than the determination threshold.
Figure 8:
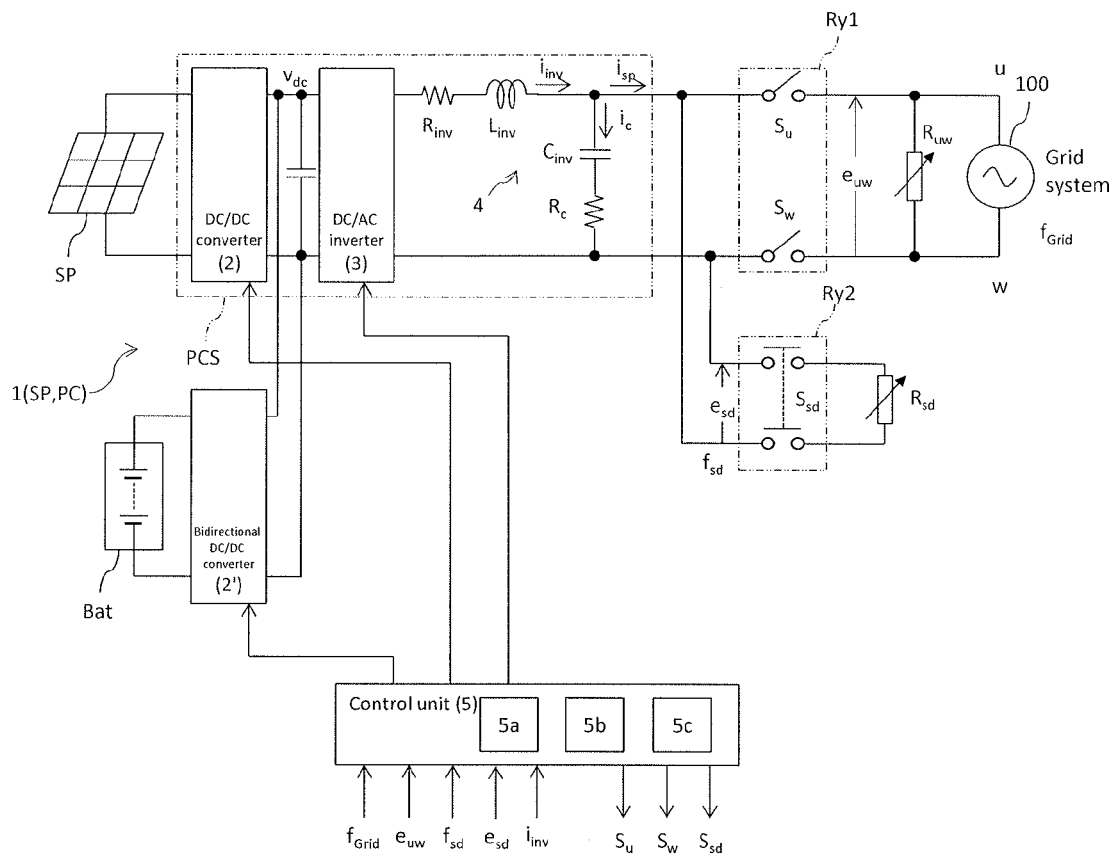
FIG. 8 is a circuit block configuration diagram of a distributed power supply according to another embodiment.

If the contacts of the grid interconnection relay Ry1 are normal with no welding and the commercial power system is connected with no load or a light load, the maximum value $I_{sp.max}$ of the output current $i_{sp}$ of the power conditioner PCS is regarded as constantly being not more than the predetermined threshold $I_{sp.chk}$, as indicated in FIG. 7.

The display panel of the power conditioner PCS turns ON abnormality indication when an error flag is set. According to the present embodiment, with the rated power $P_{sd.rated}$ of 1.5 kW at grid independent operation as a reference value, the threshold $I_{sp.chk}$ is set to 2 A and the sampling cycle is set to 0.5 $T_{sd}$ (see FIG. 6). The sampling cycle is 10 msec. if the stand-alone power system frequency is 50 Hz.

In step S15, as to a variation state of the maximum value $I_{sp.max}$ of the output current $i_{sp}$, if a state not satisfying conditions that the maximum value $I_{sp.max}$ is less than the threshold $I_{sp.chk}$ at least three consecutive times and its value tends to increase lasts for a predetermined period (e.g. several cycles) as indicated in FIG. 7, it is determined that the commercial power system is connected with no load or a light load (S15, N). The process flow then proceeds to the voltage determination in step S17. Determination is optionally repeated a plurality of times in consideration of erroneous detection due to noise and in order for reliable detection of the variation state.

In the voltage determination, the stand-alone power system voltage $e_{sd}$ of the power conditioner PCS and the effective value of the commercial power system voltage $e_{uw}$ are measured during a predetermined delay period $n \cdot T_{chk}$ (n is a positive integer) (S17), and a magnitude relation is determined between an absolute value $|E_{sd.rms} - E_{uw.rms}|$ of the difference between these values and a value obtained by multiplying the reference voltage $E_{chk}$ set in the voltage setting step by a predetermined confidence coefficient z (S18).

In a case where the grid interconnection relay Ry1 has no welded contact, it is detected that the commercial power system voltage is 0 V and the output voltage of the power conditioner PCS is 40 V upon power cut of the commercial power system. Assuming the confidence coefficient z=0.5 (z is a positive number satisfying z<1), a comparison value 20 V (=40×0.5) is less than the absolute value $|E_{sd.rms} - E_{uw.rms}|$=40 V of the difference.

In another case where the grid interconnection relay Ry1 has a welded contact, it is detected that the commercial power system voltage is 40 V and the output voltage of the power conditioner PCS is 40 V. In this case, the comparison value 20 V (=40×0.5) is more than the absolute value $|E_{sd.rms}-E_{uw.rms}|=0$ V of the difference.

In a case where the grid interconnection relay Ry1 has no welded contact, it is detected that the commercial power system voltage is 100 V and the output voltage of the power conditioner PCS is 0 V. Assuming the confidence coefficient z=0.5 (z is a positive number satisfying z<1), a comparison value 50 V (=100×0.5) is less than the absolute value $|E_{sd.rms}-E_{uw.rms}|=100$ V of the difference.

In another case where the grid interconnection relay Ry1 has a welded contact, it is detected that the commercial power system voltage is 100 V and the output voltage of the power conditioner PCS is 100 V. In this case, the comparison value 50 V (=100×0.5) is more than the absolute value $|E_{sd.rms}-E_{uw.rms}|=100$ V of the difference.

If the value obtained by multiplying the reference voltage $E_{chk}$ by the confidence coefficient z is determined to be more than the absolute value $|E_{sd.rms}-E_{uw.rms}|$ of the difference in step S18, the grid interconnection relay Ry1 is determined to have a welded contact and a flag is set in the error flag memory area set in the memory (S16).

If the value obtained by multiplying the reference voltage $E_{chk}$ by the confidence coefficient z is determined to be less than the absolute value $|E_{sd.rms}-E_{uw.rms}|$ of the difference, the grid interconnection relay Ry1 is determined to be normal and the flag in the error flag memory area set in the memory is reset (S19).

Determined in step S20 is an error flag state. If an error flag is set (S20, Y), a corresponding relay contact is determined to be welded and accordingly executed is abnormality handling of turning ON abnormality indication on the display panel of the power conditioner PCS or the like (S21).

As long as no set error flag is found in step S20 (S20, N), the process from steps S12 to S22 is repeated until abnormality determination is completed in each of the three states, namely, the state where all the contacts $S_u$ and $S_w$ of the grid interconnection relay Ry1 are controlled to open, and the states where either one of the contacts $S_u$ and $S_w$ is controlled to close.

The delay period $T_{chk}$ is set to three cycles (n=3) of the commercial power system frequency or the stand-alone power system frequency so as to enable calculation of the effective value according to sampling values for at least the three cycles. The delay period $T_{chk}$ has only to be set to a plurality of cycles and is not limited to the three cycles.

A circuit element configured to detect an output voltage and an output current of the power conditioner PCS, as well as a commercial power system voltage is originally required for control of the power conditioner PCS and there is thus no need to separately provide any sensor or any circuit element for determination of welding of the grid interconnection relay Ry1.

According to the method of detecting an abnormality of the grid interconnection relay Ry1 of the present invention, whether or not the contacts of the grid interconnection relay Ry1 have a welding abnormality is reliably detected regardless of whether or not the AC load $R_{uw}$ is connected, and regardless of whether or not there is a commercial power system voltage.

Other embodiments of the present invention will be described below.

The embodiment described above exemplifies the case where the power conditioner PCS is configured for single-phase output in the present invention. The present invention is also applicable to a case where the power conditioner PCS is configured for three-phase output and the grid interconnection relay Ry1 includes three contacts $S_u$, $S_v$, and $S_w$.

The abnormality detection device for the grid interconnection relay Ry1 according to the above embodiment exemplifies the distributed power supply including the solar panel SP and the power conditioner PCS connected to the solar panel SP. The power generator incorporated in the distributed power supply is not limited to the solar panel SP but is appropriately selected from a wind power generator, a fuel cell, and the like.

Furthermore, as indicated in FIG. 7, the present invention is applicable also to a distributed power supply including a secondary battery Bat such as a lithium ion battery connected with a DC bus voltage via a bidirectional DC/DC converter 2'.

The abnormality detection device for the grid interconnection relay Ry1 can be incorporated in such a case where the distributed power supply is configured to store power generated by the solar panel SP in the secondary battery Bat via the bidirectional DC/DC converter 2' and supply a stand-alone power system with DC power stored in the secondary battery Bat at night.

Figure 9:
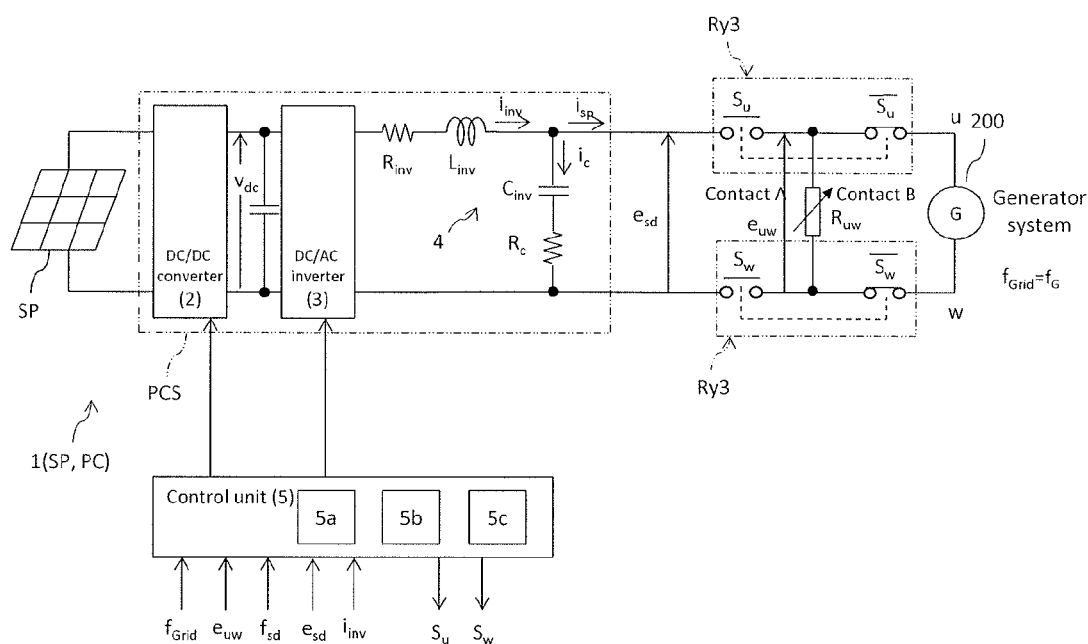
FIG. 9 is a circuit block configuration diagram of a distributed power supply according to still another embodiment.

The abnormality detection device for the grid interconnection relay according to the present invention can be incorporated in a stand-alone solar power generator system configured such that a power generator system 200 including a single-phase AC dynamo G and provided with a distributed power supply including the solar panel SP, and power supply switching relays Ry3 each including a normally opened contact A and a normally closed contact B and achieving complementary power supply to the load $R_{uw}$ of a stand-alone power system, as depicted in FIG. 9.

The power generator system 200 is configured such that only power generated by the single-phase AC dynamo G is supplied to the load $R_{uw}$ via the normally closed contacts B at night whereas only power generated by the solar panel SP is supplied to the load $R_{uw}$ via the normally opened contacts A in the daytime.

Even in a case where the power generator system 200 thus configured switches the power supplier to the load $R_{uw}$ from the single-phase AC dynamo G to the solar panel SP, the abnormality detection device for the specific relay described above achieves detection of an abnormality of the power supply switching relay Ry3. In this case, the power supply switching relay Ry3 corresponds to the specific relay in the present invention. In the following description, a power supply system from the single-phase AC dynamo G will be referred to as a commercial power system for convenience.

Figure 10:
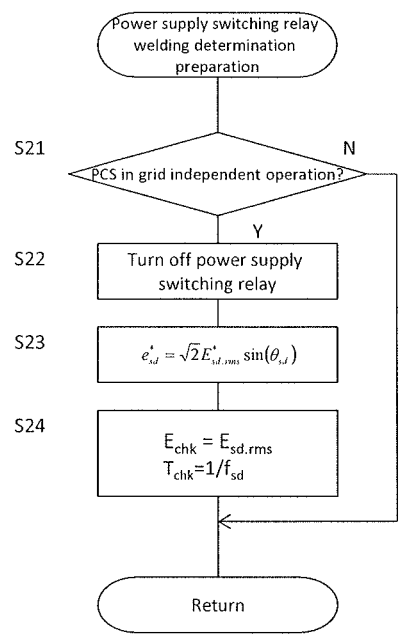
FIG. 10 is a flowchart of voltage determination of a single-phase AC dynamo in the distributed power supply depicted in FIG. 9 according to the different embodiment.

As depicted in FIG. 10, if power generated by the solar panel SP becomes equal to power generated by the commercial power system in the daytime to enable power supply from the power conditioner PCS to the load $R_{uw}$ (S21), all the contacts A of the power supply switching relays Ry3 are controlled to open (S22), a command value of an output voltage of the power conditioner PCS at abnormality detection is set (S23), a reference value $E_{chk}$ for contact welding determination is set to an effective value $E_{sd.rms}$ of an output voltage at grid independent operation, and a delay period $T_{chk}$ in this case is set to a reciprocal of a stand-alone power system frequency (S24).

Figure 11:
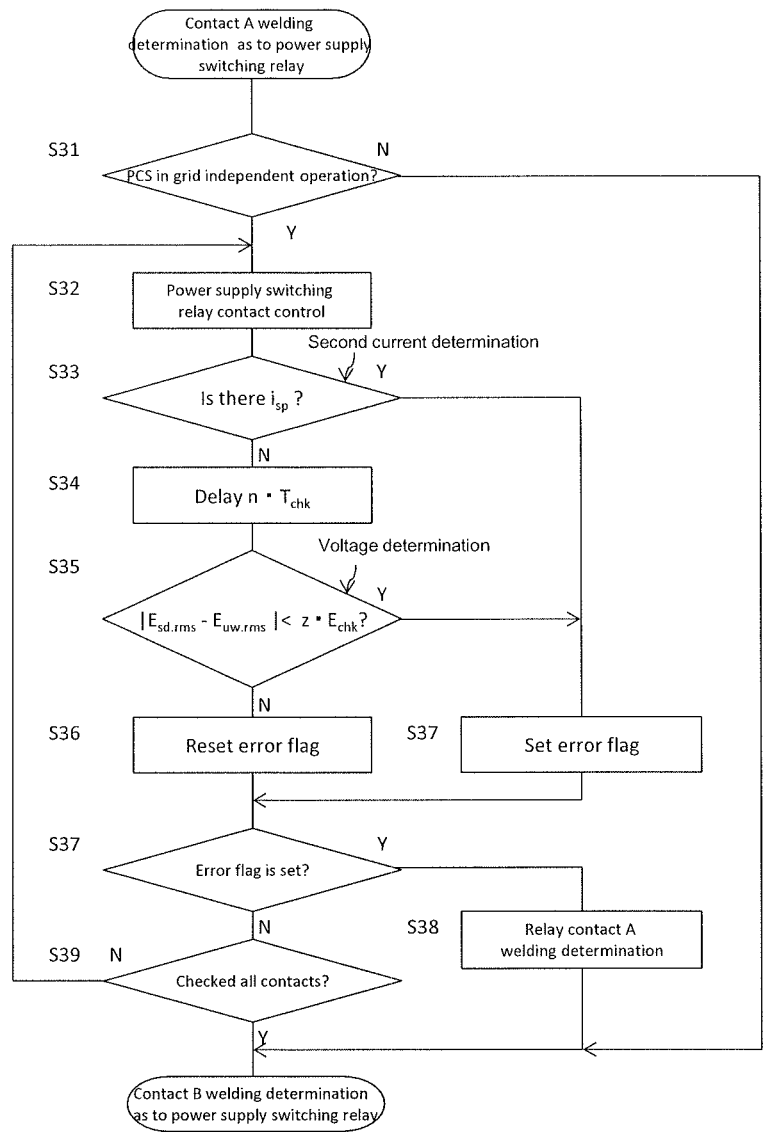
FIG. 11 is a flowchart of a method of detecting an abnormality of a contact A of a power supply switching relay in the distributed power supply depicted in FIG. 9 according to the different embodiment.
Figure 12:
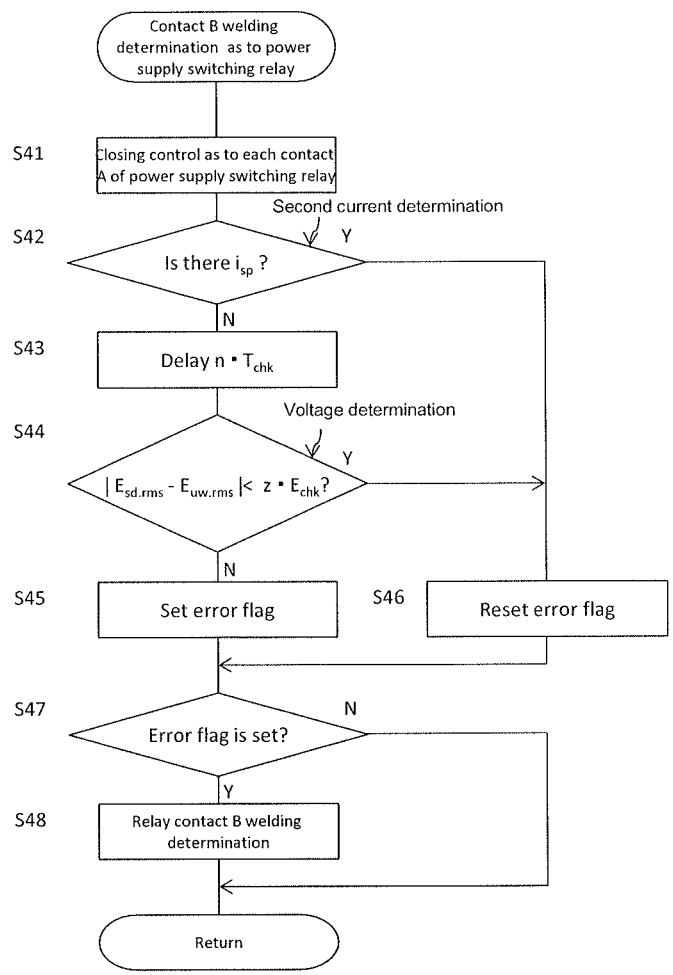
FIG. 12 is a flowchart of a method of detecting an abnormality of a contact B of the power supply switching relay in the distributed power supply depicted in FIG. 9 according to the different embodiment.

As depicted in FIG. 11, if grid independent operation of the power conditioner PCS starts (S31), welding determination is executed as to the contacts A of the power supply switching relays Ry3. A contact control step similar to that described earlier is initially executed (S32), and second current determination (S33) of abnormality determination as to the power supply switching relay Ry3 is executed in accordance with whether or not the power conditioner PCS has an output current in the state where the contact A of the power supply switching relay Ry3 is controlled to open.

The second current determination (S33) includes a process similar to that described with reference to FIG. 4. If the power supply switching relay Ry3 is determined to be normal in the second current determination (S33), voltage determination is executed.

In the voltage determination, an output voltage $e_{sd}$ of the power conditioner PCS and an effective value of a commercial power system voltage $e_{uw}$ are measured during a predetermined delay period (S34), and a magnitude relation is determined between an absolute value $|E_{sd.rms}-E_{uw.rms}|$ of the difference between these values and a value obtained by multiplying the reference voltage $E_{chk}$ set in the voltage setting step by a predetermined confidence coefficient z (S35).

If the value obtained by multiplying the reference voltage $E_{chk}$ by the confidence coefficient z is determined to be more than the absolute value $|E_{sd.rms}-E_{uw.rms}|$ of the difference in step S35, the contact A of the power supply switching relay Ry3 is determined to be welded and a flag is set in the error flag memory area set in the memory (S37).

If the value obtained by multiplying the reference voltage $E_{chk}$ by the confidence coefficient z is determined to be less than the absolute value $|E_{sd.rms}-E_{uw.rms}|$ of the difference, the power supply switching relay Ry3 is determined to be normal and the flag in the error flag memory area set in the memory is reset (S36).

Determined in step S37 is an error flag state. If an error flag is set (S37, Y), a corresponding relay contact is determined to be welded and accordingly executed is abnormality handling of turning ON abnormality indication on the display panel of the power conditioner PCS or the like (S38).

As long as no set error flag is found in step S37 (S37, N), the process from steps S32 to S39 is repeated until abnormality determination is completed in each of the three states, namely, the state where all the contacts A, $S_u$ and $S_w$, of the power supply switching relays Ry3 are controlled to open, and the states where either one of the contacts A, $S_u$ and $S_w$, is controlled to close.

Welding determination is subsequently executed as to the contacts B of the power supply switching relays Ry3. All the contacts A are initially closed, and second current determination (S42) of abnormality determination as to the power supply switching relay Ry3 is executed in accordance with whether or not the power conditioner PCS has an output current in the state where all the contacts B of the power supply switching relays Ry3 are controlled to open (S41).

The second current determination (S42) includes a process similar to that described with reference to FIG. 4. If a current $i_{sp}$ is detected in the second current determination (S42, Y), the contact B is determined not to be welded and the error flag is reset (S46).

If the current $i_{sp}$ is not detected in step S42 (S42, N), voltage determination in steps S43 and S44 is executed.

In the voltage determination, an output voltage $e_{sd}$ of the power conditioner PCS and an effective value of a commercial power system voltage $e_{uw}$ are measured during a predetermined delay period (S43), and a magnitude relation is determined between an absolute value $|E_{sd.rms}-E_{uw.rms}|$ of the difference between these values and a value obtained by multiplying the reference voltage $E_{chk}$ set in the voltage setting step by a predetermined confidence coefficient z (S44).

If the value obtained by multiplying the reference voltage $E_{chk}$ by the confidence coefficient z is determined to be more than the absolute value $|E_{sd.rms}-E_{uw.rms}|$ of the difference in step S44, the contact B of the power supply switching relay Ry3 is determined to be normal with no welding and the flag in the error flag memory area set in the memory is reset (S46).

If the value obtained by multiplying the reference voltage $E_{chk}$ by the confidence coefficient z is determined to be less than the absolute value $|E_{sd.rms}-E_{uw.rms}|$ of the difference, the contact B of the power supply switching relay Ry3 is determined to be abnormal and a flag is set in the error flag memory area set in the memory (S45).

Determined in step S47 is an error flag state. If an error flag is set (S47, Y), a corresponding relay contact is determined to be welded and accordingly executed is abnormality handling of turning ON abnormality indication on the display panel of the power conditioner PCS or the like (S48).

The expression "each contact of the specific relay is controlled to open" in the present embodiment means that "each normally opened contact A is controlled to open" or that "each normally closed contact B is controlled to open", and does not mean that "the normally opened contact A and the normally closed contact B are simultaneously controlled to open".

These embodiments described above merely exemplify the method of detecting an abnormality of the specific relay and the power conditioner according to the present invention. The description is not intended to limit the technical scope of the present invention. It is obvious that the specific circuit configuration and abnormality detection algorithm can appropriately be modified in design as long as the functional effects of the present invention are exerted.

REFERENCE SIGNS LIST

1: Distributed power supply
2: DC/DC converter
3: DC/AC inverter
4: LC filter
5: Control unit
5a: Converter controller
5b: Inverter controller
5c: Abnormality detector
PCS: Power conditioner
Ry1: Grid interconnection relay (Specific relay)
Ry2: Stand-alone power system relay
Ry3: Power supply switching relay (Specific relay)
$S_u$, $S_w$: Contact

The invention claimed is:
1. A relay abnormality detection device configured to detect an abnormality of a specific relay upon switching to grid independent operation and incorporated in a power conditioner including an inverter configured to convert DC power to AC power, and an LC filter configured to remove a high frequency component from an output voltage of the inverter, the power conditioner configured to switch between grid connected operation by interconnection with a commercial power system via a specific relay for grid interconnection and grid independent operation by power supply to a stand-alone power system via a stand-alone power system relay or configured to switch between power supply from the commercial power system via a specific relay for power supply switching and power supply by grid independent operation, the relay abnormality detection device comprising
an abnormality detector configured to execute:
commercial power system voltage determination of determining whether or not there is a commercial power system voltage;
if it is determined that there is a commercial power system voltage through the commercial power system voltage determination, first current determination of abnormality determination as to the specific relay according to whether or not there is an input current to the power conditioner in a state where a contact of the specific relay is controlled to open; and
if it is determined that there is no commercial power system voltage through the commercial power system voltage determination, second current determination of abnormality determination as to the specific relay according to whether or not there is an output current from the power conditioner in the state where the contact of the specific relay is controlled to open.

2. The relay abnormality detection device according to claim 1, wherein, assuming that the LC filter has capacitor capacity $C_{inv}$, internal resistance $R_c$, and a capacitor current $i_c$, and a stand-alone power system voltage $e_{sd}$ is a measurement value, the first current determination includes calculation, as the input current, of the capacitor current $i_c$ in accordance with a mathematical expression [Expression 1]:

$$i_c = \frac{sC_{inv}}{sR_cC_{inv} + 1} \cdot e_{sd}.$$

3. The relay abnormality detection device according to claim 2, wherein the first current determination includes determining that the specific relay has an abnormality if the input current measured in a predetermined sampling cycle has an absolute value not less than a predetermined threshold a plurality of consecutive times and the absolute value of the input current increases every time the input current is measured.

4. The relay abnormality detection device according to claim 1, wherein, assuming that the LC filter has capacitor capacity $C_{inv}$, internal resistance $R_c$, and a capacitor current $i_c$, the stand-alone power system has a voltage $e_{sd}$, and an inverter current $i_{inv}$ is a measurement value, the second current determination includes calculating, as the output current, an output current $i_{sp}$ of the power conditioner in accordance with a mathematical expression [Expression 2]:

$i_{sp}=i_{inv}-i_c.$

5. The relay abnormality detection device according to claim 4, wherein the second current determination includes obtaining a difference between values prior to and subsequent to a maximum value of the output current of the power conditioner, and determining that the specific relay has an abnormality if the difference is not less than a predetermined threshold a plurality of consecutive times and an absolute value of the output current of the power conditioner decreases every time the output current is measured.

6. The relay abnormality detection device according to claim 1, wherein the abnormality detector is configured to execute the first current determination or the second current determination after each contact of the specific relay is controlled to open, and execute the first current determination or the second current determination every time one of the contacts is controlled to close independently.

7. The relay abnormality detection device according to claim 1, wherein the abnormality detector is configured to further execute, before or after the first current determination or the second current determination,
voltage setting of setting an output voltage of the power conditioner at abnormality detection to a different value and setting a reference voltage for abnormality determination as to the specific relay to a different value in accordance with a result of the commercial power system voltage determination, and
voltage determination of abnormality determination as to the specific relay according to a magnitude relation between a difference between a voltage of the power conditioner and a voltage of the commercial power system and a value obtained by multiplying the reference voltage by a predetermined confidence coefficient in the state where the contact of the specific relay is controlled to open.

8. The relay abnormality detection device according to claim 1, wherein the commercial power system voltage determination includes determining whether or not there is a commercial power system voltage in accordance with a magnitude relation between a value obtained by multiplying a preliminarily set value of the stand-alone power system voltage of the power conditioner by a predetermined confidence coefficient and the commercial power system voltage, and a magnitude relation between a value obtained by multiplying a stand-alone power system frequency by a predetermined confidence coefficient and a commercial power system frequency.

9. A power conditioner of a single-phase or three-phase type, provided with an inverter configured to convert DC power to AC power, and an LC filter configured to remove a high frequency component from an output voltage of the inverter,
the power conditioner comprising:
a control unit configured to switch between grid connected operation by interconnection with a commercial power system via a specific relay for grid interconnection and grid independent operation by power supply to a stand-alone power system via a stand-alone power system relay, or configured to switch between power supply from the commercial power system via a specific relay for power supply switching and power supply by grid independent operation; and
an abnormality detection device incorporated in the control unit and including an abnormality detector configured to execute:
commercial power system voltage determination of determining whether or not there is a commercial power system voltage;
if it is determined that there is a commercial power system voltage through the commercial power system voltage determination, first current determination of abnormality determination as to the specific relay according to whether or not there is an input current to the power conditioner in a state where a contact of the specific relay is controlled to open; and
if it is determined that there is no commercial power system voltage through the commercial power system voltage determination, second current determination of abnormality determination as to the specific relay according to whether or not there is an output current from the power conditioner in the state where the contact of the specific relay is controlled to open.

10. A power conditioner of a single-phase or three-phase type, provided with an inverter configured to convert DC power to AC power, and an LC filter configured to remove a high frequency component from an output voltage of the inverter, the power conditioner comprising:

a control unit configured to switch between power supply from the commercial power system via a specific relay for power supply switching including a contact A and contact B and power supply by grid independent operation; and an abnormality detection device incorporated in the control unit and configured to execute commercial power system voltage determination of determining whether or not there is a commercial power system voltage, if it is determined that there is no commercial power system voltage through the commercial power system voltage determination, second current determination of abnormality determination as to the specific relay according to whether or not there is an output current from the power conditioner in a state where the contact of the specific relay is controlled to open, voltage setting of setting an output voltage of the power conditioner at abnormality detection to a different value and setting a reference voltage for abnormality determination as to the specific relay to a different value in accordance with a result of the commercial power system voltage determination, and voltage determination of abnormality determination as to the specific relay according to a magnitude relation between a difference between a voltage of the power conditioner and a voltage of the commercial power system and a value obtained by multiplying the reference voltage by a predetermined confidence coefficient in the state where the contact of the specific relay is controlled to open.

* * * * *